(12) United States Patent
Hayase

(10) Patent No.: US 11,626,790 B2
(45) Date of Patent: Apr. 11, 2023

(54) POWER CONVERSION DEVICE MINIMIZING FOOTPRINT

(71) Applicant: Mitsubishi Electric Corporation, Tokyo (JP)

(72) Inventor: Kei Hayase, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 71 days.

(21) Appl. No.: 17/057,137

(22) PCT Filed: Sep. 21, 2018

(86) PCT No.: PCT/JP2018/035111
§ 371 (c)(1),
(2) Date: Nov. 20, 2020

(87) PCT Pub. No.: WO2020/026462
PCT Pub. Date: Feb. 6, 2020

(65) Prior Publication Data
US 2021/0126520 A1 Apr. 29, 2021

(30) Foreign Application Priority Data
Jul. 30, 2018 (JP) .............................. JP2018-142183

(51) Int. Cl.
*H02M 1/08* (2006.01)
*H01L 25/07* (2006.01)
(Continued)

(52) U.S. Cl.
CPC .............. *H02M 1/08* (2013.01); *H01L 25/07* (2013.01); *H01L 25/18* (2013.01); *H02M 3/003* (2021.05);
(Continued)

(58) Field of Classification Search
CPC ........ H02M 1/08; H02M 3/003; H02M 3/335; H02M 3/33573; H02M 7/003;
(Continued)

(56) References Cited

U.S. PATENT DOCUMENTS

2015/0208556 A1   7/2015   Kodama et al.
2016/0307826 A1*  10/2016  Mcknight-Macneil ......................
                                             H01L 24/33
(Continued)

FOREIGN PATENT DOCUMENTS

JP   2009-177040 A   8/2009
JP   5535292 B2      7/2014
(Continued)

OTHER PUBLICATIONS

C. Chen, Y. Chen, Y. Li, Z. Huang, T. Liu and Y. Kang, "An SiC-Based Half-Bridge Module With an Improved Hybrid Packaging Method for High Power Density Applications," in IEEE Transactions on Industrial Electronics, vol. 64, No. 11, pp. 8980-8991, Nov. 2017 (Year: 2017).*

(Continued)

*Primary Examiner* — Kyle J Moody
*Assistant Examiner* — Jye-June Lee
(74) *Attorney, Agent, or Firm* — Sughrue Mion, PLLC; Richard C. Turner

(57) ABSTRACT

A power conversion device includes a circuit board on which wirings are formed and plural semiconductor switching elements are mounted; and a driver circuit which is mounted on the circuit board, and operates at least two of the plural semiconductor switching elements together; wherein the plural semiconductor switching elements are provided as packages having a same shape, and placed in such a positional relationship in which an inter-control-terminal distance that is a distance between their respective control (Continued)

terminals is shorter than a length of a terminal side that is a side of each of the packages at which the control terminal is placed.

20 Claims, 8 Drawing Sheets

(51) Int. Cl.
   *H01L 25/18* (2023.01)
   *H02M 3/335* (2006.01)
   *H02M 7/00* (2006.01)
   *H02M 7/537* (2006.01)
   *H02M 3/00* (2006.01)

(52) U.S. Cl.
   CPC ....... *H02M 3/335* (2013.01); *H02M 3/33573* (2021.05); *H02M 7/003* (2013.01); *H02M 7/537* (2013.01)

(58) Field of Classification Search
   CPC ........ H02M 7/537; H01L 25/07; H01L 25/18; H01L 25/072; H01L 23/34
   See application file for complete search history.

(56) References Cited

U.S. PATENT DOCUMENTS

| | | | |
|---|---|---|---|
| 2017/0093285 A1* | 3/2017 | Sasao | H02M 3/158 |
| 2018/0198378 A1 | 7/2018 | Xu et al. | |
| 2019/0123657 A1 | 4/2019 | Miura et al. | |

FOREIGN PATENT DOCUMENTS

| | | |
|---|---|---|
| JP | 5823020 B2 | 11/2015 |
| JP | 2017-184601 A | 10/2017 |

OTHER PUBLICATIONS

TPH3202L Series, Datasheet, Transfphorm Inc., Mar. 27, 2018 (Year: 2018).*

Extended European Search Report dated Aug. 12, 2021, issued by the European Patent Office in application No. 18928159.5.

International Search Report for PCT/JP2018/035111 dated Dec. 4, 2018 (PCT/ISA/210).

* cited by examiner

POWER CONVERSION DEVICE MINIMIZING FOOTPRINT

CROSS REFERENCE TO RELATED APPLICATIONS

This application is a National Stage of International Application No. PCT/JP2018/035111 filed Sep. 21, 2018, claiming priority based on Japanese Patent Application No. 2018-142183 filed Jul. 30, 2018.

TECHNICAL FIELD

The present application relates to a power conversion device which includes semiconductor switching elements, and in particular to an arrangement of the semiconductor switching elements.

BACKGROUND ART

In power conversion devices, in order to downsize them, water-cooling systems are used in some cases (for example, Patent Document 1, Patent Document 2). The power conversion devices of Patent Document 1 and Patent Document 2 employ semiconductor switching elements which are each encapsulated in a cooling-oriented package with leads, for example, a TO247 package or the like. In the power conversion device of Patent Document 1, a metallic cover placed on a coolant passage in which a coolant flows and a cooling face of each of the semiconductor switching elements, are made opposite to each other through a heat-dissipation sheet made of an insulative material, and the semiconductor switching elements are fixed by screws to the metallic cover. In the power conversion device of Patent Document 2, an upper-side member placed on a coolant passage in which a coolant flows and a cooling face of each of the semiconductor switching elements, are made opposite to each other through a heat-conductive resin sheet made of an insulative material, and the semiconductor switching elements are fixed by screws to the upper-side member.

According to the power conversion devices of Patent Document 1 and Patent Document 2, screw holes for fixing the packages of the semiconductor switching elements are required for a cooler that is provided with the coolant passage structure. In order to ensure the strength of the coolant passage structure, the screw fixing positions are set nearer to the wall of a casing or bottom-side member. The plural semiconductor switching elements included in the power conversion device are placed so that the screw positions of the packages are aligned linearly and the positions of their respective leads are aligned uniformly, namely, their mounting directions are matched with each other. In this way, in the power conversion devices of Patent Document 1 and Patent Document 2, the coolant passage structure is simplified while ensuring the strength of the coolant passage structure.

CITATION LIST

Patent Document

Patent Document 1: Japanese Patent Publication No. 5823020 (FIG. 1, FIG. 2)
Patent Document 2: Japanese Patent Publication No. 5535292 (FIG. 1, FIG. 2)

SUMMARY OF INVENTION

Problems to be Solved by Invention

Meanwhile, when a wide bandgap semiconductor element that is formed of a wide bandgap semiconductor material whose bandgap is wide and which allows high speed operation, namely a GaN (Gallium Nitride) based material, SiC (Silicon Carbide) or the like, is used as each of the semiconductor switching elements, a surface-mount package with short leads is chosen in order to ensure stability in high-speed-operation based operations. Further, even if the semiconductor switching elements do not use the wide bandgap semiconductor material but uses silicon, such a case may also arise where a surface-mount package with short leads is chosen in order to ensure stability in high-speed-operation based operations. For getting a heat-dissipation structure in these cases, the package is attached to a cooler through a metallic board or a glass epoxy board. At this time, in view of easy mounting of the plural semiconductor switching elements included in the power conversion device, it is typical to employ such an arrangement for the semiconductor elements in which the mounting directions of their packages are matched with each other, namely, the mounting arrangement of semi-conductor switching elements employed in each of Patent Document 1 and Patent Document 2.

Further, because the power conversion device includes a power circuit that deals with high electric power, it is required to prevent noise coupling with a control circuit that deals with small signals, to thereby ensure operational stability of the semiconductor switching elements. Thus, in the layout of the power conversion device, the power circuit region and the control circuit region have to be isolated from each other. Because the semiconductor switching element performs switching of a high-power signal upon receiving a control signal as a small signal from the control circuit, it is required that the mounting directions of the packages of the semiconductor switching elements be matched with each other. For example, when the packages are typical surface mount packages (D2PAK or D3PAK), because their respective drain terminals and gate terminals are placed at the same sides of the packages, the gate terminals are directed toward an IC (Integrated Circuit) of a driver circuit, and the wirings between the gate terminals and the driver circuit are made short and made not to intersect with the wiring of the power circuit.

Here, let's assume a case where the semiconductor switching element is exemplified by that using a GaN based material, and two or more semiconductor switching elements are operated by a single driver circuit. In a typical surface mount package of the semiconductor switching element using a GaN based material, its bottom face forms the source terminal. Thus, in order to cause a drain wiring that is connected to the drain terminal directed toward the driver circuit as a control circuit, to extend toward the power circuit region, it is required to place the drain wiring between the adjacent semiconductor switching elements, so that it is inevitable that the mutual distance between the adjacent semiconductor switching elements shall be increased. Furthermore, in the case where the semiconductor switching elements deal with a high voltage, in order to ensure the creepage distance between the source terminal and the drain terminal, it is inevitable that the distance between the adjacent semiconductor switching elements shall be more increased. In the case where two or more semiconductor switching elements whose mutual distance is increased as described above are operated by a single driver circuit, distances between the single driver circuit for operating and the respective semiconductor switching elements are increased, so that operations of the semiconductor switching elements become unstable. Note that, even in the case of the semiconductor switching element using silicon, if the gate resistance is reduced to thereby increase the speed of switching, such a case may arise where operations of the semiconductor switching elements become unstable.

A technique disclosed in the present description has been made to solve the problem as described above, and an object thereof is, at the time two or more semiconductor elements are operated by a single driver circuit, to enhance the operational stability of the semiconductor switching elements.

Means for Solving Problems

A power conversion device disclosed as an example in this description is a power conversion device which includes plural semiconductor switching elements and performs power conversion of input power by controlling on-eriods of the plural semiconductor switching elements, said power conversion device comprising: a circuit board on which wirings are formed and the plural semiconductor switching elements are mounted; and a driver circuit which is mounted on the circuit board, and operates at least two of the plural semiconductor switching elements together. The semiconductor switching elements each have a control terminal to which a control signal generated by the driver circuit is inputted, a first power terminal at which a voltage potential serving as a voltage reference for the control signal is produced, and a second power terminal through which power flows that is higher than that of the control signal. The semiconductor switching elements to be operated together by the driver circuit are provided as packages having a same shape and placed in such a positional relationship in which an inter-control-terminal distance that is a distance between their respective control terminals is shorter than a length of a terminal side that is a side of each of the packages at which the control terminal is placed.

Effect of Invention

According to a power conversion device disclosed as an example in this description, because the semiconductor switching elements placed in such a positional relationship in which the distance between their respective control terminals is shorter than the length of the terminal side, are operated together by the driver circuit, it is possible to enhance the operational stability of the semiconductor switching elements.

MODES FOR CARRYING OUT INVENTION

Embodiment 1

Figure 1:
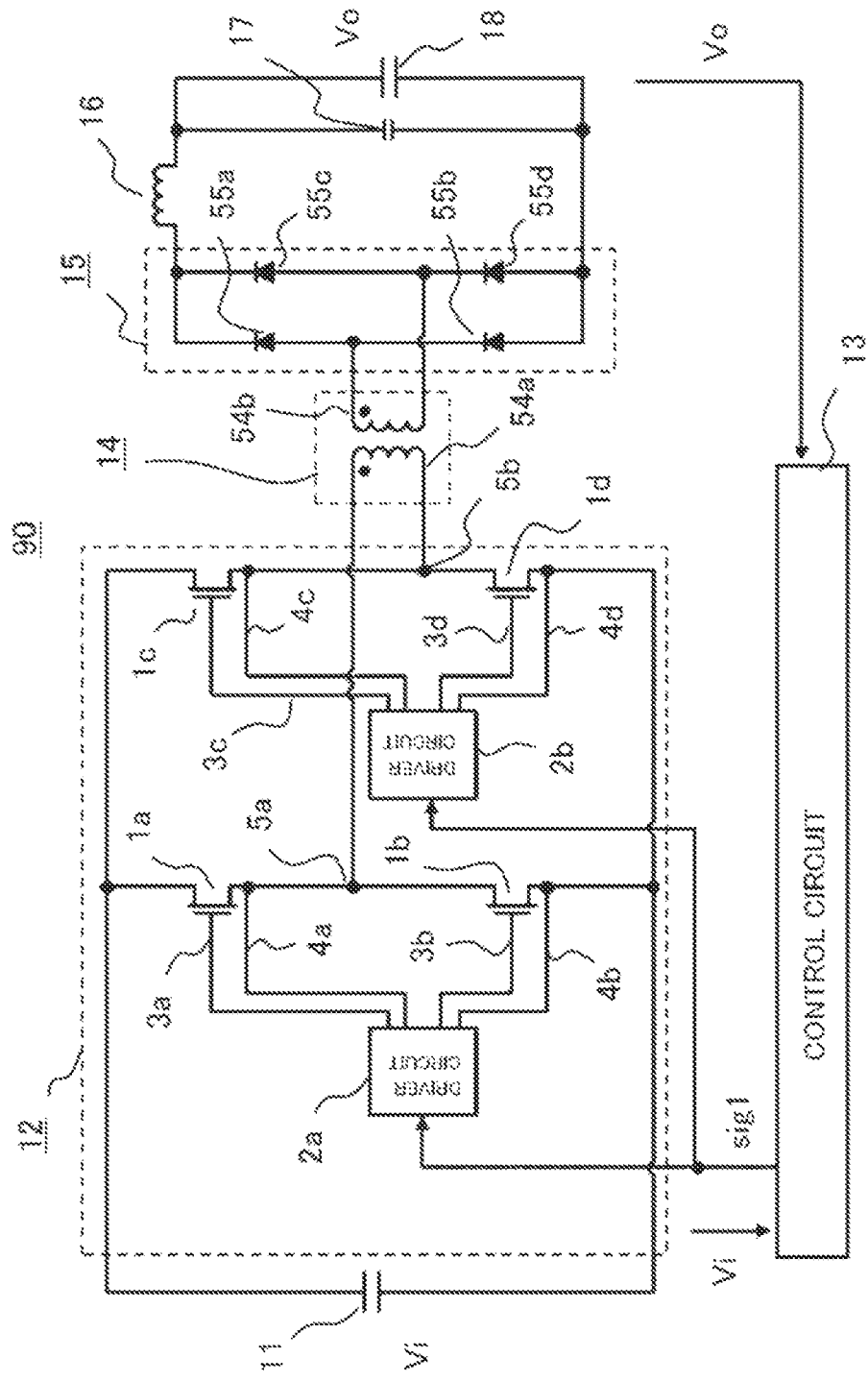
FIG. 1 is a diagram showing a configuration of a power conversion device according to Embodiment 1.
Figure 2:
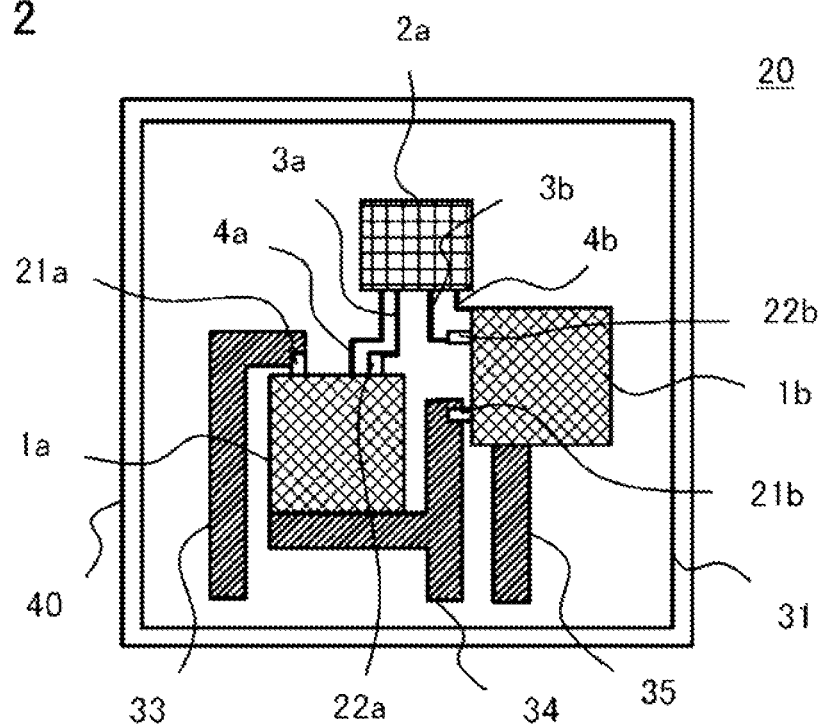
FIG. 2 is a diagram showing a configuration of a semiconductor module which includes semiconductor switching elements in FIG. 1.
Figure 3:
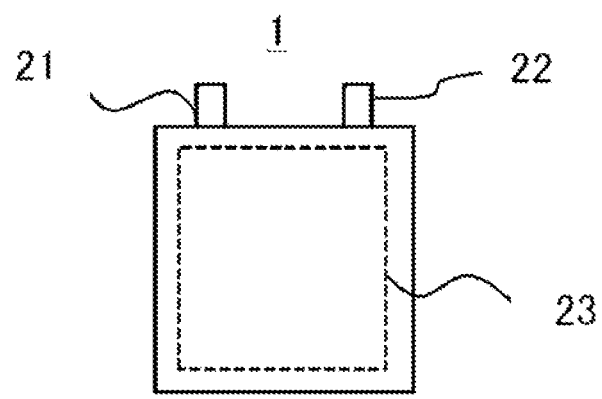
FIG. 3 is a diagram showing a package of the semiconductor switching element in FIG. 1.

FIG. 1 is a diagram showing a configuration of a power conversion device according to Embodiment 1, and FIG. 2 is a diagram showing a configuration of a semiconductor module which includes semiconductor switching elements in FIG. 1. FIG. 3 is a diagram showing a package of the semiconductor switching element in FIG. 1. An exemplary power conversion device 90 shown in FIG. 1 is an insulated full-bridge type DC-DC converter. The power conversion device 90 includes a transformer 14, a single-phase inverter 12, a rectifier circuit 15, a reactor 16, an output capacitor 17 and a control circuit 13. The control circuit 13 monitors an input voltage Vi and an output voltage Vo to thereby output a gate signal sig1 for controlling semiconductor switching elements 1*a*, 1*b*, 1*c*, 1*d* in the single-phase inverter 12. The single-phase inverter 12 is a power conversion device that performs power conversion from DC input power supplied from an input power source 11 into AC power by controlling on-periods of the plural semiconductor switching elements 1*a*, 1*b*, 1*c*, 1*d*.

The transformer 14 insulates the single-phase inverter 12 and the rectifier circuit 15 from each other. The transformer 14 has a primary winding 54*a* and a secondary winding 54*b*. The single-phase inverter 12 is connected to the primary winding 54*a* of the transformer 14. The single-hase inverter 12 converts the input voltage Vi provided as a DC voltage of the input power source 11, into an AC voltage. The single-phase inverter 12 includes the plural semiconductor switching elements 1*a*, 1*b*, 1*c*, 1*d*, a driver circuit 2*a* for operating the semiconductor switching elements 1*a*, 1*b*, and a driver circuit 2*b* for operating the semiconductor switching elements 1*c*, 1*d*. The driver circuits 2*a*, 2*b* are each a control circuit that deals with small signals. The semiconductor switching elements 1*a*, 1*b*, 1*c*, 1*d* are each, for example, a MOS-FET (Metal Oxide Semiconductor-Field Effect Transistor) whose base material is silicon, namely, which uses silicon. The semiconductor switching elements 1*a*, 1*b*, 1*c*, 1*d* have reverse conduction characteristics in a source-to-drain direction. The semiconductor switching elements 1*a*, 1*b*, 1*c*, 1*d* constitute a full-bridge circuit. The driver circuits 2*a*, 2*b* are each a driver circuit IC that deals with small signals.

The semiconductor switching elements 1*a*, 1*c* are each placed on an upper-arm side, and the semiconductor switching elements 1*b*, 1*d* are each placed on a lower-arm side. The semiconductor switching element on the upper-arm side and the semiconductor switching element on the lower-arm side are serially connected to each other. Specifically, the source terminal of the semiconductor switching element 1*a* and the drain terminal of the semiconductor switching element 1*b* are serially connected to each other to constitute a series circuit. The source terminal of the semiconductor switching element 1*c* and the drain terminal of the semiconductor switching element 1*d* are serially connected to each other to constitute a series circuit. The primary winding 54*a* of the transformer 14 is interconnected between a connection point 5*a* of the semiconductor switching element 1*a* and the semiconductor switching element 1*b* and a connection point 5*b* of the semiconductor switching element 1*c* and the semiconductor switching element 1*d*.

The rectifier circuit 15 is connected to the secondary winding 54*b* of the transformer 14. The rectifier circuit 15 includes diodes 55*a*, 55*b*, 55*c*, 55*d* as rectifier elements (semiconductor elements). The diodes 55*a*, 55*b*, 55*c*, 55*d* constitute a full-bridge circuit. The reactor 16 that is used for output smoothing and the output capacitor 17, are connected to the output of the rectifier circuit 15, so that the output voltage Vo as a DC voltage is outputted to a load 18.

The control circuit 13 is placed outside the main circuit of the power conversion device 90. The input voltage Vi and the output voltage Vo are each monitored and inputted to the control circuit 13. The control circuit 13 outputs the gate signal sig1 for controlling the semiconductor switching elements 1*a* to 1*d*, to thereby control on-duties (on-periods) of the semiconductor switching elements 1*a* to 1*d* so that the output voltage Vo becomes a target voltage. At this time, in order to operate the semiconductor switching elements 1*a* to 1*d*, the gate signal sig1 is inputted to the driver circuits 2*a*, 2*b*. The driver circuit 2*a*, 2*b* each have 2-channel configuration capable of outputting drive signals (gate input signals) independently to the two semiconductor switching elements. The driver circuit 2*a* is connected to the gate terminal and the source terminal of the semiconductor switching element 1*a* by way of a gate wiring 3*a* and a source wiring 4*a*, respectively, and connected to the gate terminal and the source terminal of the semiconductor switching element 1*b* by way of a gate wiring 3*b* and a source wiring 4*b*, respectively. The driver circuit 2*b* is connected to the gate terminal and the source terminal of the semiconductor switching element 1*c* by way of a gate wiring 3*c* and a source wiring 4*c*, respectively, and connected to the gate terminal and the source terminal of the semiconductor switching element 1*d* by way of a gate wiring 3*d* and a source wiring 4*d*, respectively. Based on the gate signal sig1 from the control circuit 13, the driver circuit 2*a* operates the semiconductor switching elements 1*a*, 1*b*. Based on the gate signal sig1 from the control circuit 13, the driver circuit 2*b* operates the semiconductor switching elements 1*c*, 1*d*. The gate terminal is a control terminal to which a control signal (drive signal) is inputted; the source terminal is a first power terminal through which power flows that has been supplied from the input power source 11 and that is higher than that of the control signal, and at which a voltage potential serving as a voltage reference for the control signal is produced; and the drain terminal is a second power terminal through which power flows that has been supplied from the input power source 11 and that is higher than that of the control signal.

Description will be made about an example of mounting structure of components of the single-phase inverter 12 in FIG. 1. The single-phase inverter 12 is configured with: a semiconductor module 20 which includes a half-bridge circuit composed of the semiconductor switching elements 1*a*, 1*b* and the driver circuit 2*a*; and a semiconductor module 20 which includes a half-bridge circuit composed of the semiconductor switching elements 1*c*, 1*d* and the driver circuit 2*b*. In FIG. 2, the semiconductor module 20 is shown which includes the half-bridge circuit composed of the semiconductor switching elements 1*a*, 1*b* and the driver circuit 2*a*. With respect to the semiconductor module 20 which includes the half-bridge circuit composed of the semiconductor switching elements 1*c*, 1*d* and the driver circuit 2*b*, the arrangement about its configuration and its respective components is the same as that of the semiconductor module 20 in FIG. 2. The semiconductor module 20 which includes the half-bridge circuit composed of the semiconductor switching elements 1*a*, 1*b* and the driver circuit 2*a*, and the semiconductor module 20 which includes the half-bridge circuit composed of the semiconductor switching elements 1*c*, 1*d* and the driver circuit 2*b*, are connected to each other by means of, for example, a bus bar formed of a metal plate, or the like. Here, the semiconductor module 20 which includes the semiconductor switching elements 1*a*, 1*b* and the driver circuit 2*a* for operating them will be described.

For example, the semiconductor switching elements 1*a*, 1*b* are surface-mounted on a surface of the circuit board 31 that is a metallic board using a metal as a base material. A case is shown here in which the semiconductor switching elements 1*a*, 1*b* are each provided as D2PAK or D3PAK commonly used as a surface mount type. The package shapes of the semiconductor switching elements 1*a*, 1*b* to be operated together by the driver circuit 2*a* are the same. The semiconductor switching elements 1*a*, 1*b*, 1*c*, 1*d* that constitute the full bridge generally have the same package shape. As shown in FIG. 3, in each of these semiconductor switching elements 1, its face to be surface-mounted on the circuit board 31 forms a source terminal 23, and a drain terminal 21 and a gate terminal 22 are placed at one side of that element. The side in the package at which the drain terminal 21 and the gate terminal 22 are placed will be referred to as a terminal side. Note that, for these semiconductor switching elements, reference numeral 1 is used collectively, and reference numerals 1*a*, 1*b*, 1*c*, 1*d*, etc. are used when they are to be described distinctively. For the drain terminals, reference numeral 21 is used collectively and reference numerals 21*a*, 21*b*, etc. are used when they are to be described distinctively. For the gate terminals, reference numeral 22 is used collectively and reference numerals 22*a*, 22*b*, etc. are used when they are to be described distinctively. The semiconductor switching element 1*a* and the semiconductor switching element 1*b* are mounted in a state in which one of them is rotated on the mounting face of the circuit board 31 by about 90° relative to the other one, and so that the gate terminal 22*a* and the gate terminal 22*b* become closer to each other. To the back face (a face opposite to the front face) of the circuit board 31, a cooler 40 for cooling the semiconductor switching elements 1*a*, 1*b* is attached.

The gate terminal 22*a* of the semiconductor switching element 1*a* is connected to the driver circuit 2*a* through the gate wiring 3*a*. The source terminal formed on the mounting face (bottom face) of the semiconductor switching element 1a is connected to the driver circuit 2a through the source wiring 4a. The gate terminal 22b of the semiconductor switching element 1b is connected to the driver circuit 2a through the gate wiring 3b. The source terminal of the semiconductor switching element 1b is connected to the driver circuit 2a through the source wiring 4b. The drain terminal 21a of the semiconductor switching element 1a is connected to an on-board wiring 33; the source terminal of the semiconductor switching element 1a and the drain terminal 21b of the semiconductor switching element 1b are connected to an on-board wiring 34; and the source terminal of the semiconductor switching element 1b is connected to an on-board wiring 35. The on-board wiring 34 is a wiring that connects to each other the source terminal of the semiconductor switching element 1a and the drain terminal 21b of the semiconductor switching element 1b, namely, a wiring that constitutes the connection point 5a in FIG. 1. The potential at the on-board wiring 34 is a midpoint potential in the half bridge. Note that, in FIG. 2, a case is shown where the gates of the semiconductor switching elements 1a, 1b are connected to the driver circuit 2a by using only the wiring; however, such a configuration may be used in which a gate circuit of a gate resistor, a ferrite bead, a Zener diode, a capacitor or the like, is provided between the semiconductor switching element 1a, 1b and the driver circuit 2a.

In the semiconductor module 20 of Embodiment 1, as shown in FIG. 2, the semiconductor switching elements 1a, 1b are mounted in a state in which one of them is rotated on the mounting face of the circuit board 31 by about 90° relative to the other semiconductor switching element, and so that the respective gate terminals 22a, 22b become closer to each other. Namely, an alignment angle provided between the respective semiconductor switching elements 1a, 1b is about 90°. Said differently, an angle provided between the terminal side of the package of the semiconductor switching element 1a at which the drain terminal 21a and the gate terminal 22a are placed, and the terminal side of the package of the semiconductor switching element 1b at which the drain terminal 21b and the gate terminal 22b are placed, is about 90°. In other words, an angle provided between a reference line that is parallel to the terminal side of the package of the semiconductor switching element 1a at which the drain terminal 21a and the gate terminal 22a are placed, and a reference line that is parallel to the terminal side of the package of the semiconductor switching element 1b at which the drain terminal 21b and the gate terminal 22b are placed, is about 90°. Accordingly, in the semiconductor module 20 of Embodiment 1, it becomes possible to bring the gate terminals 22a, 22b closer to each other than the length of the terminal side of the package of the semiconductor switching element 1a or 1b, that is a shortest distance between these terminals as a physical limit in the case where the semiconductor switching elements 1a, 1b are mounted in the same direction. Using FIG. 4 and FIG. 5, an inter-gate-terminal distance L that is a distance between the gate terminal 22a of the semiconductor switching element 1a and the gate terminal 22b of the semiconductor switching element 1b, will be described.

Figure 4:
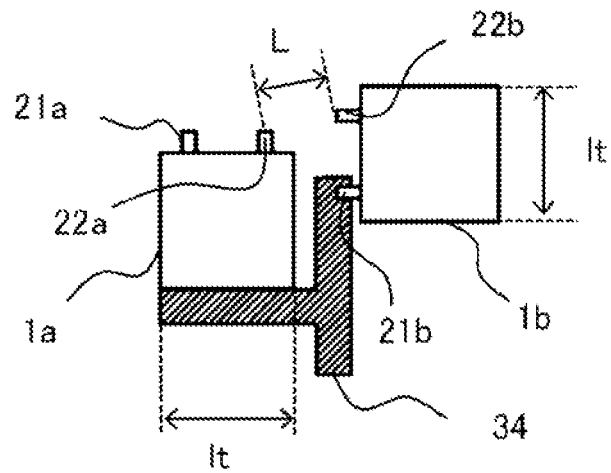
FIG. 4 is a diagram for illustrating an inter-gate-terminal distance between the semiconductor switching elements in FIG. 2.
Figure 5:
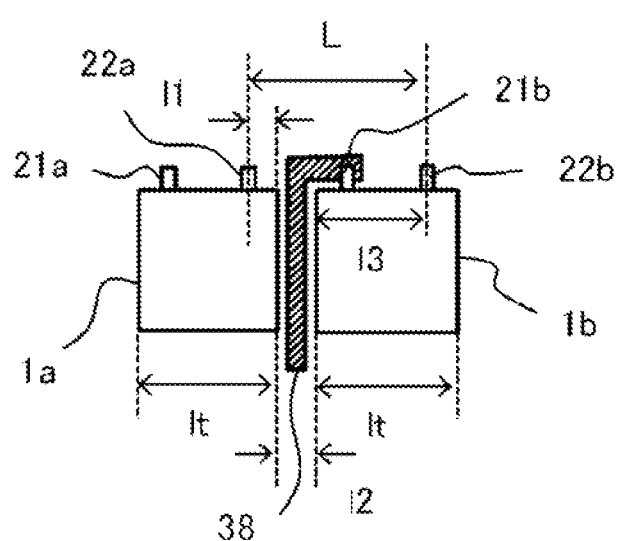
FIG. 5 a diagram for illustrating an inter-gate-terminal distance between semiconductor switching elements in a comparative example.

FIG. 4 is a diagram for illustrating the inter-gate-terminal distance between the semiconductor switching elements in FIG. 2, and FIG. 5 is a diagram for illustrating the inter-gate-terminal distance between semiconductor switching elements in a comparative example. FIG. 4 results from the extraction of the semiconductor switching elements 1a, 1b and the on-board wiring 34 from FIG. 2. Note that the filled-out patterns on the packages of the semiconductor switching elements 1a, 1b are omitted. In the semiconductor switching elements 1a, 1b, each length of package sides at which their respective gate terminals 22a, 22b are placed, namely, each length of their terminal sides, is a terminal-side length 1t. As shown in FIG. 4, the inter-gate-terminal distance L that is a distance between the gate terminal 22a of the semiconductor switching element 1a and the gate terminal 22b of the semiconductor switching element 1b is shorter than the terminal-side length 1t. Note that the inter-gate-terminal distance L is defined as a distance from the center of the head end of the gate terminal 22a to the center of the head end of the gate terminal 22b.

The comparative example of FIG. 5 is an example in which the semiconductor switching element 1a and the semiconductor switching element 1b are displaced from each other in a parallel direction, namely, an example in which the alignment angle between the semiconductor switching elements 1a, 1b is 0°. In the comparative example, the drain terminal 21b of the semiconductor switching element 1b is connected to an on-board wiring 38, and the on-board wiring 38 is placed between the semiconductor switching element 1a and the semiconductor switching element 1b. What is indicated by "11" is a length in the semiconductor switching element 1a, from the center of the head end of the gate terminal 22a to the edge side facing the semiconductor switching element 1b; indicated by "12" is an inter-element distance that is a distance between the elements, namely, the semiconductor switching elements 1a, 1b; and indicated by "13" is a length in the semiconductor switching element 1b, from the edge side facing the semiconductor switching element 1a to the center of the head end of the gate terminal 22b. The inter-gate-terminal distance L in the comparative example is the sum of the length 1l, the inter-element distance 12 and the length 13, and thus becomes longer than the terminal-side length 1t.

According to the power conversion device 90 of Embodiment 1, the semiconductor switching elements 1a, 1b in the semiconductor module 20 are placed in a state in which they are mutually rotated by about 90°. Thus, unlike the comparative example in which the inter-gate-terminal distance L is longer than the terminal-side length 1t, it is possible to make the inter-gate-terminal distance L shorter than the terminal-side length 1t that is the shortest distance as a physical limit. According to the power conversion device 90 of Embodiment 1, because of such an arrangement of the semiconductor switching elements 1a, 1b, in the case where the plural semiconductor switching elements 1a, 1b are to be operated by the single driver circuit 2a, the distances between the driver circuit 2a and the respective plural semiconductor switching elements 1a, 1b are shortened, so that it is possible to stably operate the semiconductor switching elements 1a, 1b. Further, according to the power conversion device 90 of Embodiment 1, the gate terminals 22a, 22b and the driver circuit 2a in the semiconductor module 20 become closer to each other, so that the region of the control circuit that deals with small signals, namely, the region of the driver circuit 2a can be packed easily. Thus, it becomes possible to isolate from each other the region of the control circuit that deals with small signals and the region of the power circuit that includes the semiconductor switching elements 1a, 1b and that deals with high electric power, while ensuring a distance enough to prevent noise coupling therebetween. According to the power conversion device 90 of Embodiment 1, since the isolation distance between the region of the control circuit that deals with small signals and the region of the power circuit that deals with high electric power can be ensured, it is possible to prevent noise coupling from the power circuit that deals with high electric power to the control circuit that deals with small signals, to thereby further enhance the operational stability of the semiconductor switching elements 1a, 1b.

Meanwhile, in the case where the semiconductor switching elements 1a, 1b are bottom-side cooling elements as shown in FIG. 2, namely, in the case where they are each provided as a package of surface mount type in which the area of the bottom-face terminal (source terminal 23) is formed larger than the area of a connection face where the first power terminal (drain terminal 21) placed at the terminal side is connected to a wiring (on-board wirings 33, 34) on the circuit board 31, it is unable to cause the on-board wiring to run on portions of the circuit board 31 under the bottom faces (mounting faces) of the semiconductor switching elements 1a, 1b. Thus, when the semiconductor switching elements 1a, 1b are configured so that the drain terminals 21a, 21b and the gate terminals 22a, 22b are respectively placed at the same sides as shown in FIG. 2 and FIG. 5, in the case where the semiconductor switching elements 1a, 1b are mounted in the same direction, as described in the comparative example of FIG. 5, it is required to cause the semiconductor switching elements 1a, 1b to be spaced from each other in order to draw out from one of the terminals, a wiring (for example, the on-board wiring 38 for the drain of the semiconductor switching element 1b) for which a creepage distance has to be ensured relative to the electrode formed on the bottom face. In this case, the interval between the semiconductor switching elements 1a, 1b is larger than the width of the on-board wiring 38, so that the gate terminal 22a of the semiconductor switching element 1a and the gate terminal 22b of the semiconductor switching element 1b become farther from each other.

Figure 6:
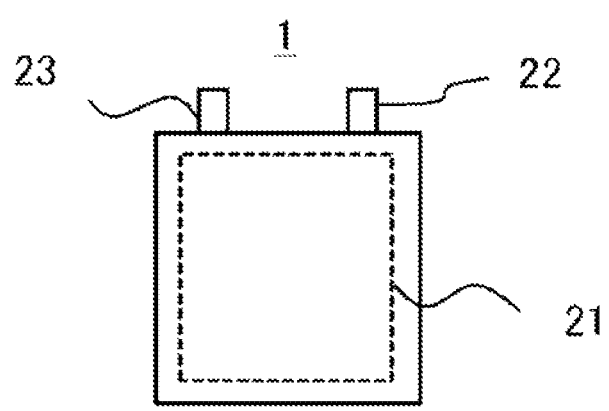
FIG. 6 is a diagram showing another package of the semiconductor switching element in FIG. 1.

However, when, as shown in FIG. 2, the semiconductor switching elements 1a, 1b are mounted in a state in which one of them is rotated on the mounting face of the circuit board 31 by about 90° relative to the other semiconductor switching element, it is possible to ensure the draw-out region for the wiring of the semiconductor switching element 1b while keeping the respective gate terminals 22a, 22b of the semiconductor switching elements 1a, 1b close to each other. Thus, according to the power conversion device 90 of Embodiment 1, in the case where the plural semiconductor switching elements 1a, 1b are to be operated by the single driver circuit 2a, the distances between the driver circuit 2a and the respective plural semiconductor switching elements 1a, 1b are shortened, so that it is possible to enhance the operational stability of the semiconductor switching elements 1a, 1b. Note that this applies similarly to another package in which, as shown in FIG. 6, the bottom face of the semiconductor switching element 1 forms the drain terminal 21, and the source terminal 23 and the gate terminal 22 are both placed at the same side. FIG. 6 is a diagram showing the other package of the semiconductor switching element in FIG. 1.

Meanwhile, when, as shown in FIG. 2, a metallic board is used as the circuit board 31, only at most two layers may be established as the wiring layers. Thus, in the case where the semiconductor switching elements 1a, 1b are mounted in the same direction, in order to ensure drawing-out of the drain wiring and the creepage distance for that wiring that are essentially required, the gate terminal 22a of the semiconductor switching element 1a and the gate terminal 22b of the semiconductor switching element 1b become farther from each other as described in the comparative example of FIG. 5. In contrast, according to the power conversion device 90 of Embodiment 1, with the employment of the arrangement of the semiconductor switching elements 1a, 1b shown in the semiconductor module 20 of Embodiment 1, it is possible to bring the gate terminals 22a of the semiconductor switching element 1a and the gate terminal 22b of the semiconductor switching element 1b closer to each other while ensuring drawing-out of the drain wiring and the creepage distance therefor, namely, the inter-gate-terminal distance L can be shorter than the terminal-side length 1t. This makes it possible to enhance the operational stability of the semiconductor switching elements 1a, 1b.

It is noted that the same applies to the case where a glass-epoxy based circuit board comprised of multiple wiring layers is used as the circuit board 31. In this case, cooling of the semiconductor switching elements 1a, 1b is accomplished by a cooler 40 that is placed in an insulated state through an insulating member (for example, an insulating paper) on a face of the circuit board 31 opposite to its mounting face on which the circuit components, such as the semiconductor switching elements 1a, 1b and the like, are mounted. Thus, in the glass-epoxy board, for the purpose of reducing the thermal resistance of the circuit board 31, wiring layers in the regions where the semiconductor switching elements 1a, 1b are mounted are all connected to each other through vias (VIA). For that reason, in the regions where the semiconductor switching elements are mounted, all wiring layers in the glass-epoxy board have the same potential, so that it is unable to cause a wiring to run under the bottom faces of the semiconductor switching elements 1a, 1b. Thus, in the case where the semiconductor switching elements 1a, 1b are mounted in the same direction, the respective gate terminal 22a and gate terminal 22b of the semiconductor switching elements 1a, 1b become farther from each other. Accordingly, even in the case where a circuit board comprised of multiple wiring layers is used as the circuit board 31, according to the power conversion device 90 of Embodiment 1, it is possible to bring the gate terminals 22a of the semiconductor switching element 1a and the gate terminal 22b of the semiconductor switching element 1b closer to each other while ensuring drawing-out of the drain wiring and the creepage distance therefor, namely, the inter-gate-terminal distance L can be shorter than the terminal-side length 1t. Thus, the distances between the driver circuit 2a and the respective plural semiconductor switching elements 1a, 1b are shortened, so that it is possible to enhance the operational stability of the semiconductor switching elements 1a, 1b.

Further, although a case has been described where the semiconductor switching elements 1a, 1b are provided as bottom-side cooling packages, even if the semiconductor switching elements 1a, 1b are provided as top-side cooling packages, the power conversion device 90 of Embodiment 1 has an effect similar to the above. Furthermore, among top-side cooling packages, a package whose drain terminal, source terminal and gate terminal are all provided as leads, has no mounting face on its bottom face, and according to that package, even in the case where the semiconductor switching elements 1a, 1b are mounted in the same direction (comparative example A), it is possible to ensure, on the circuit board 31, wiring regions under the bottom faces of the packages. This allows to make the distance between the semiconductor switching elements 1a, 1b shorter than that in the comparative example of FIG. 5. However, according to the power conversion device 90 of Embodiment 1, it is possible to bring the gate terminal 22a of the semiconductor switching element 1a and the gate terminal 22b of the semiconductor switching element 1b closer to each other than the terminal-side length 1t of each of the semiconductor switching elements 1a, 1b that is the shortest distance as a physical limit in the case where the these elements are mounted in the same direction, namely, the respective gate terminals 22a, 22b of the semiconductor switching elements 1a, 1b can be closer to each other than in the case of the comparative example A. Thus, the distances between the driver circuit 2a and the respective plural semiconductor switching elements 1a, 1b are shortened, so that it is possible to enhance the operational stability of the semiconductor switching elements 1a, 1b.

Figure 7:
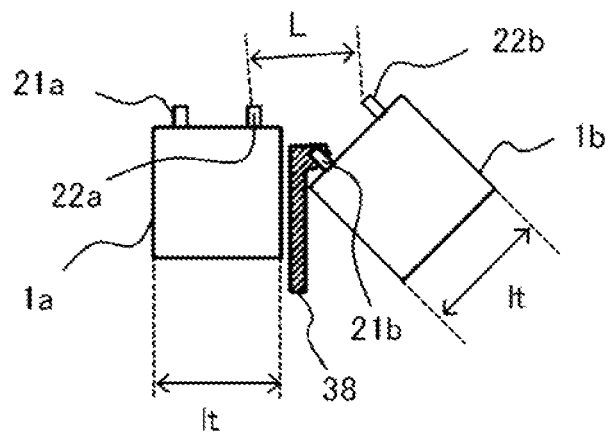
FIG. 7 is a diagram showing another arrangement example about the arrangement of two semiconductor elements in FIG. 1.
Figure 8:
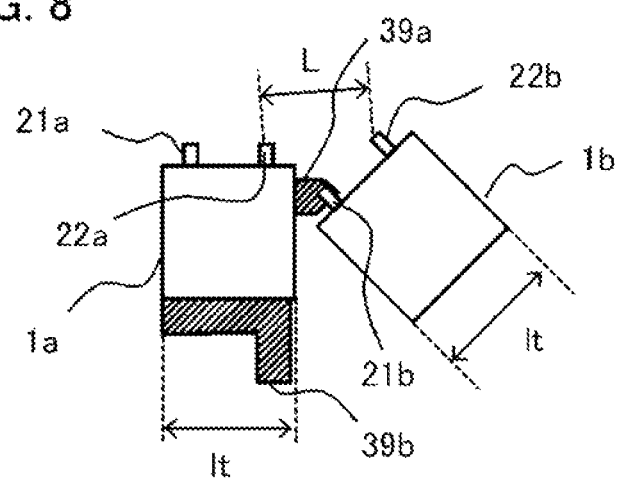
FIG. 8 is a diagram showing still another arrangement example about the arrangement of two semiconductor elements in FIG. 1.

Further, in FIG. 2, a case has been shown where the semiconductor switching elements 1a, 1b are mounted in a state in which one of them is rotated on the mounting face of the circuit board 31 by about 90° relative to the other semiconductor switching device, and so that the respective gate terminals 22a, 22b of the semiconductor switching elements 1a, 1b become closer to each other. However, as shown in FIG. 7 and FIG. 8, the alignment angle between the semiconductor switching elements 1a, 1b may be 45°. FIG. 7 is a diagram showing another arrangement example about the arrangement of the two semiconductor elements in FIG. 1, and FIG. 8 is a diagram showing still another arrangement example about the arrangement of the two semiconductor elements in FIG. 1. FIG. 7 shows a case where, like in the comparative example of FIG. 5, an on-board wiring 38 is placed between the semiconductor switching element 1a and the semiconductor switching element 1b. FIG. 8 shows a case where, like in FIG. 2 and FIG. 4, the source terminal of the semiconductor switching element 1a and the drain terminal 21b of the semiconductor switching element 1b are connected to an on-board wiring 39a, and an on-board wiring 39b is connected to the source terminal of the semiconductor switching element 1a.

FIG. 7 and FIG. 8 each show a case where the alignment angle between the semiconductor switching elements 1a, 1b is 45°, in other words, show a case where an angle provided between the terminal side of the package of the semiconductor switching element 1a at which the drain terminal 21a and the gate terminal 22a are placed or a reference line that is parallel to that terminal side, and the terminal side of the package of the semiconductor switching element 1b at which the drain terminal 21b and the gate terminal 22b are placed or a reference line that is parallel to that terminal side, is 45°. As shown in FIG. 7 and FIG. 8, the inter-gate-terminal distance L that is a distance between the gate terminal 22a of the semiconductor switching element 1a and the gate terminal 22b of the semiconductor switching element 1b is shorter than the terminal-side length 1t. Thus, according to the power conversion device 90 of Embodiment 1 provided with the semiconductor module 20 in which the semiconductor switching elements 1a, 1b are placed as in FIG. 7 or FIG. 8, in the case where the plural semiconductor elements 1a, 1b are to be operated by the single driver circuit 2a, it is possible to bring the gate terminal 22a of the semiconductor switching element 1a and the gate terminal 22b of the semiconductor switching element 1b closer to each other, namely, the inter-gate-terminal distance L can be shorter than the terminal-side length 1t. Thus, the distances between the driver circuit 2a and the respective plural semiconductor switching elements 1a, 1b are shortened, so that it is possible to enhance the operational stability of the semiconductor switching elements 1a, 1b.

Figure 9:
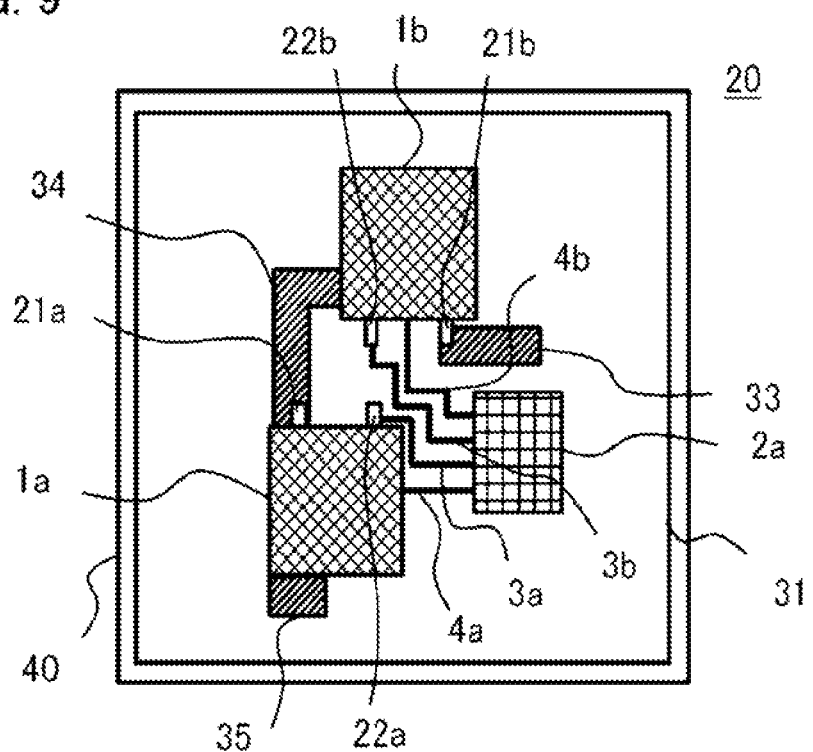
FIG. 9 is a diagram showing another configuration of the semiconductor module which includes semiconductor switching elements in FIG. 1.

Further, the alignment angle between the semiconductor switching elements 1a, 1b may be about 180°. FIG. 9 is a diagram showing another configuration of the semiconductor module which includes semiconductor switching elements in FIG. 1. FIG. 9 shows a case where the semiconductor switching elements 1a, 1b are mounted in a state in which, on the mounting face of the circuit board 31, their respective terminal sides are placed opposite to each other and one of the elements is rotated by about 180° relative to the other semiconductor switching element. Even when so mounted, for the semiconductor switching elements 1a, 1b, it is possible to bring their respective gate terminals 22a, 22b closer to each other than the terminal-side length 1t as the length of the terminal side. Thus, according to the power conversion device 90 of Embodiment 1 provided with the semiconductor module 20 shown in FIG. 9, like the power conversion device 90 of Embodiment 1 provided with the semiconductor module 20 shown in FIG. 2, the distances between the driver circuit 2a and the respective plural semiconductor switching elements 1a, 1b are shortened, so that it is possible to enhance the operational stability of the semiconductor switching elements 1a, 1b.

It is noted that, FIG. 1 has been shown as a case where the driver circuit 2a operates the serially connected semiconductor switching elements 1a, 1b by using two independent drive signals, and the driver circuit 2b operates the serially connected semiconductor switching elements 1c, 1d by using two independent drive signals. However, each set of two semiconductor switching elements to be operated by the single driver circuit may be another set. For example, it is allowed that the driver circuit 2a operates the semiconductor switching elements 1b, 1d whose source potentials are the same, and the driver circuit 2b operates the semiconductor switching elements 1a, 1c whose drain potentials are the same. In this case, the driver circuit 2a and the semiconductor switching elements 1b, 1d are mounted in one of the semiconductor modules 20, and the driver circuit 2b and the semiconductor switching elements 1a, 1c are mounted in the other semiconductor module 20. Even in this case, the distance between the respective gate terminals of the semiconductor switching elements 1b, 1d mounted in the one of the semiconductor modules 20, can be shorter than the terminal-side length 1t, and the distance between the respective gate terminals of the semiconductor switching elements 1a, 1c mounted in the other semiconductor module 20, can be shorter than the terminal-side length 1t. Thus, according to the power conversion device 90 of Embodiment 1 provided with these two semiconductor modules 20, the distances between the driver circuit and the respective plural semiconductor switching elements to be operated by that driver circuit are shortened, so that it is possible to enhance the operational stability of the semiconductor switching elements 1a, 1b, 1c, 1d. Note that the driver circuit 2a and the driver circuit 2b may be replaced with each other.

The alignment angle between the semiconductor switching elements 1a, 1b in the power conversion device 90 of Embodiment 1 will be summarized. In FIG. 2, FIG. 7, FIG. 8 and FIG. 9, such cases are shown where the alignment angle between the semiconductor switching elements 1a, 1b is 45°, about 90°, or about 180°. When the alignment angle between the semiconductor switching elements 1a, 1b is restricted to be not less than 45° but not more than 180° as relative angles, the distances between the driver circuit and the respective plural semiconductor switching elements to be operated by that driver circuit are shortened. Thus, it is possible to enhance the operational stability of the plural semiconductor switching elements.

It is noted that each of the semiconductor switching elements 1a to 1d is not limited to a MOS-FET which uses silicon, and may be an IGBT (Insulated Gate Bipolar Transistor). Further, each of the semiconductor switching elements 1a to 1d may be a MOS-FET or IGBT whose base material is a wide bandgap semiconductor material whose bandgap is wide, for example, a GaN-ased material, namely, which uses a GaN-based material. The semiconductor switching elements 1a to 1d which use a wide bandgap semiconductor material can be operated at a speed faster than that of the semiconductor switching elements 1a to 1d which use silicon, so that, at the time two or more such semiconductor switching elements are operated by the single driver circuit, when the distances between the driver circuit and the semiconductor switching elements become longer, their operations become unstable as compared with the semiconductor switching elements which use silicon. Thus, for the semiconductor switching elements 1a to 1d which use a wide bandgap semiconductor material, it is further required at the time two or more such semiconductor switching elements are operated by the single driver circuit, to enhance the operational stability of the semiconductor switching elements. Further, each of the semiconductor switching elements 1a to 1d may be a MOS-FET or IGBT which uses SiC or diamond and which is provided with a diode connected in parallel between a source and a drain thereof. A GaN-based material, SiC and diamond are each a wide bandgap semiconductor material whose band gap value is larger, namely, whose bandgap is wider, than that of silicon. Thus, a semiconductor element which uses a wide bandgap semiconductor material (wide bandgap semiconductor element) has a power loss lower than that of an element which uses silicon, and this makes it possible to enhance the efficiency of the semiconductor module 20. Further, since the wide bandgap semiconductor element has a high voltage resistance and a high allowable current density as well, it becomes possible to downsize the semiconductor module 20. Furthermore, since the wide bandgap semiconductor element has a high thermal resistance and is thus capable of high temperature operation, it becomes possible to downsize the cooler or to change the cooler into an air-cooled one. This makes it possible to further downsize the power conversion device 90.

The power conversion device 90 of Embodiment 1 is a power conversion device which includes the plural semiconductor switching elements 1a, 1b, 1c, 1d and performs power conversion of input power by controlling on-periods of the plural semiconductor switching elements 1a, 1b, 1c, 1d, said power conversion device comprising: the circuit board 31 on which wirings (on-board wirings 33, 34, 35) are formed and the plural semiconductor switching elements 1a, 1b are mounted; and the driver circuit 2a which is mounted on the circuit board 31 and operates at least two of the plural semiconductor switching elements 1a, 1b together. The semiconductor switching elements 1a, 1b each have the control terminal (gate terminal 22) to which a control signal generated by the driver circuit 2a inputted, the first power terminal (source terminal 23) at which a voltage potential serving as a voltage reference for the control signal is produced, and the second power terminal (drain terminal 21) through which power flows that is higher than that of the control signal. The plural semiconductor switching elements 1a, 1b to be operated together by the driver circuit 2a, are provided as packages having the same shape, and placed in such a positional relationship in which an inter-control-terminal distance (inter-gate-terminal distance L) that is a distance between their respective control terminals is shorter than the length (terminal-side length 1t) of the terminal side that is a side of each of the packages at which the control terminal (gate terminal 22) is placed. According to the power conversion device 90 of Embodiment 1, because of such a configuration, since the driver circuit 2a operates the plural semiconductor switching elements 1a, 1b together which are placed in the positional relationship in which the distance between their respective control terminals (inter-gate-terminal distance L) is shorter than the length of the terminal side (terminal-side length 1t), it is possible to enhance the operational stability of the semiconductor switching elements 1a, 1b.

Embodiment 2

Figure 10:
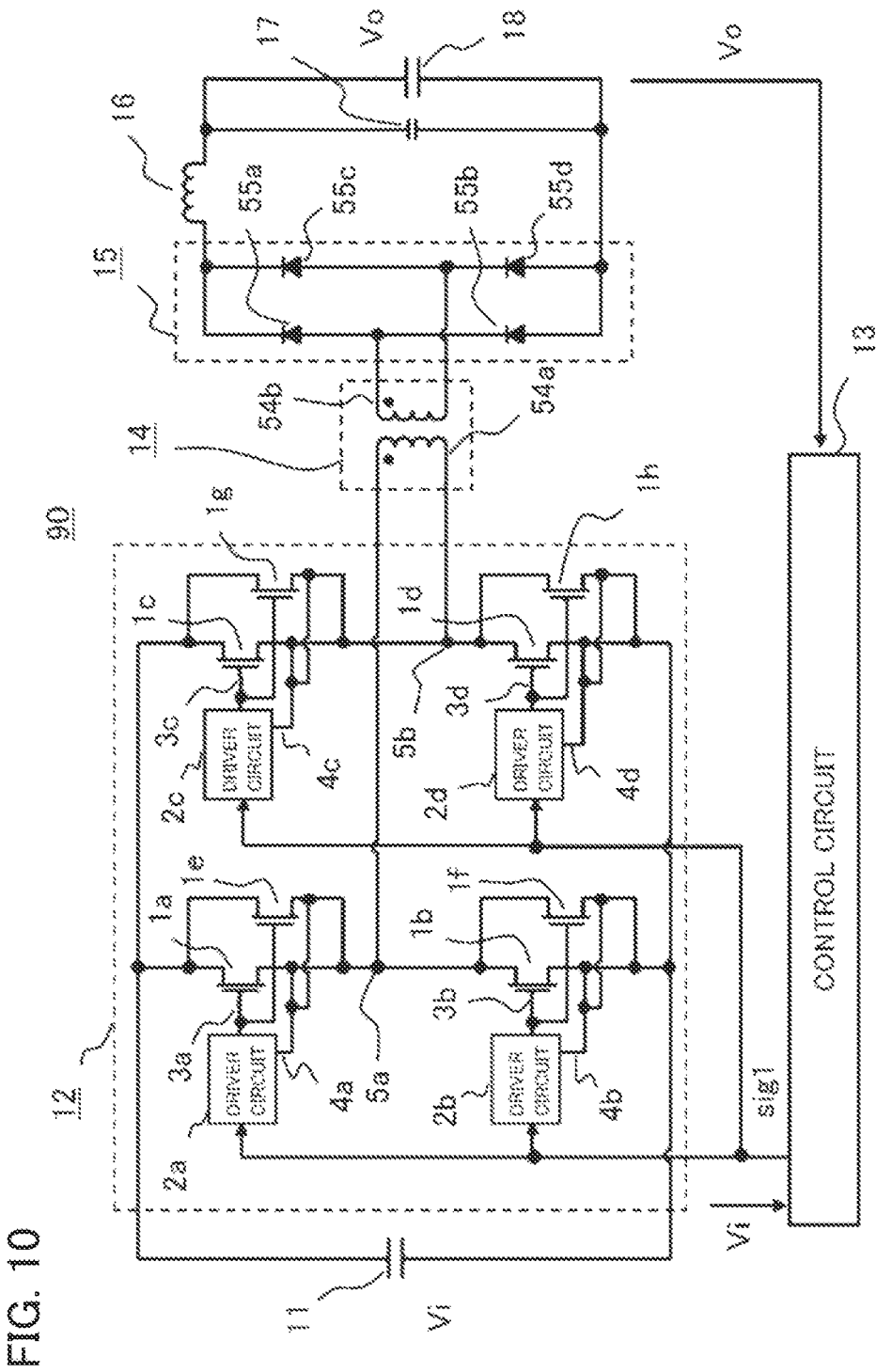
FIG. 10 is a diagram showing a configuration of a power conversion device according to Embodiment 2.
Figure 11:
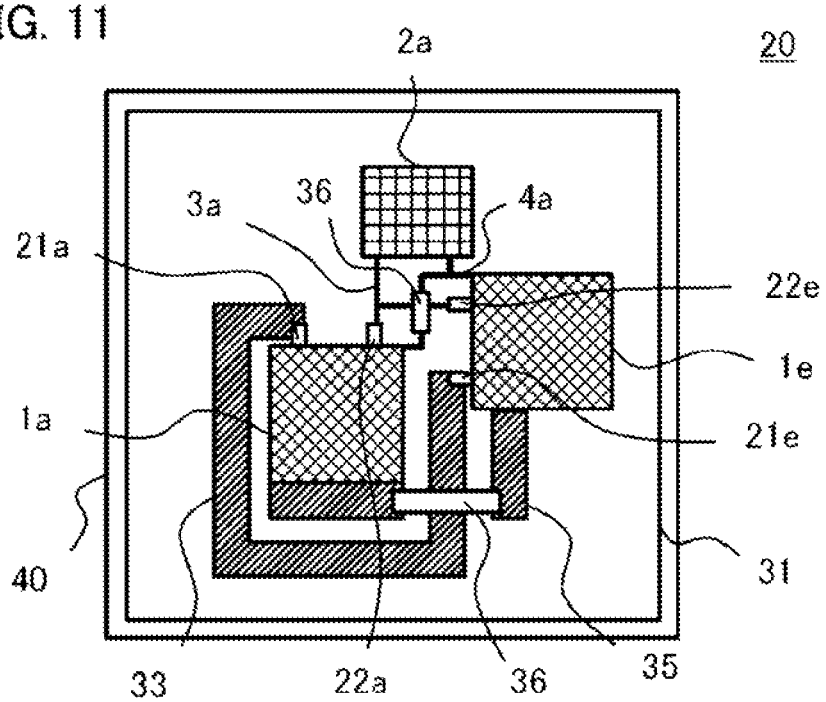
FIG. 11 is a diagram showing a configuration of a semiconductor module which includes semiconductor switching elements in FIG. 10.

In Embodiment 1, an exemplary case has been described where the semiconductor switching elements 1a, 1b are in serially-connected relationship for constituting the half bridge, and they are operated by the driver circuit having 2-channel configuration capable of outputting two drive signals, independently. In Embodiment 2, an exemplary case will be described where plural semiconductor switching elements are connected in parallel to each other, namely, in a parallel relationship, and they are operated by a driver circuit having 1-channel configuration. FIG. 10 is a diagram showing a configuration of a power conversion device according to Embodiment 2, and FIG. 11 is a diagram showing a configuration of a semiconductor module which includes semiconductor switching elements in FIG. 10. For the configuration elements that are the same as those in Embodiment 1, the same numerals are used, and description will be focused on differences from Embodiment 1.

The power conversion device 90 shown in FIG. 10 differs from the power conversion device 90 shown in FIG. 1, in the configuration of the single-phase inverter 12. In the power conversion device 90 shown in FIG. 10, semiconductor switching elements 1e, 1f, 1g, 1f are connected in parallel to the semiconductor switching elements 1a, 1b, 1c, 1d, respectively. The semiconductor switching element 1a and the semiconductor switching element 1e as a parallel pair are operated by their common driver circuit 2a. Likewise, the semiconductor switching element 1b and the semiconductor switching element 1f as another parallel pair are operated by their common driver circuit 2b; the semiconductor switching element 1c and the semiconductor switching element 1g as another parallel pair are operated by their common driver circuit 2c; and the semiconductor switching element 1d and the semiconductor switching element 1h as another parallel pair are operated by their common driver circuit 2d.

The single-phase inverter 12 is configured with: a first semiconductor module 20 which includes the semiconductor switching elements 1a, 1e and the driver circuit 2a; a second semiconductor module 20 which includes the semiconductor switching elements 1b, 1f and the driver circuit 2b; a third semiconductor module 20 which includes the semiconductor switching elements 1c, 1g and the driver circuit 2c; and a fourth semiconductor module 20 which includes the semiconductor switching elements 1d, 1h and the driver circuit 2d. In FIG. 11, the first semiconductor module 20 which includes the semiconductor switching elements 1a, 1e and the driver circuit 2a is shown. The arrangement about the configuration and respective components of each of the second to fourth semiconductor modules 20 is the same as that of the semiconductor module 20 in FIG. 11. The first semiconductor module 20 and the second semiconductor module 20 are connected to each other, and the third semiconductor module 20 and the fourth semiconductor module 20 are connected to each other, each by means of, for example, a bus bar formed of a metal plate, or the like. In addition, the first semiconductor module 20 and the third semiconductor module 20 are connected to each other, and the second semiconductor module 20 and the fourth semiconductor module 20 are connected to each other, each by means of, for example, a bus bar formed of a metal plate, or the like. Here, the semiconductor module 20 which includes the semiconductor switching elements 1a, 1e and the driver circuit 2a for operating them will be described.

The semiconductor switching elements 1a, 1e are surface-mounted on a surface of the circuit board 31 using a metal as a base material. The semiconductor switching element 1a includes a drain terminal 21a, a gate terminal 22a and a bottom-face source terminal, and the semiconductor switching element 1e includes a drain terminal 21e, a gate terminal 22e and a bottom-face source terminal. The bottom-face source terminals of the semiconductor switching elements 1a, 1e are mounted on the circuit board 31. The semiconductor switching element 1a and the semiconductor switching element 1e are mounted in a state in which one of them is rotated on the mounting face of the circuit board 31 by about 90° relative to the other one, and so that the gate terminal 22a and the gate terminal 22e become closer to each other. To the back face of the circuit board 31, a cooler 40 for cooling the semiconductor switching elements 1a, 1e is attached.

The gate terminal 22a of the semiconductor switching element 1a and the gate terminal 22e of the semiconductor switching element 1e are connected to the driver circuit 2a through a common gate wiring 3a. The source terminal formed on the mounting face (bottom face) of the semiconductor switching element 1a and the source terminal of the semiconductor switching element 1e are connected to the driver circuit 2a through a common source wiring 4a. Here, the source wiring 4a connects the source terminal of the semiconductor switching element 1a, the source terminal of the semiconductor switching element 1e and the driver circuit 2a to each other by way of a bus bar 36 so as not to intersect on the plane surface of the circuit board 31 with the gate wiring 3a. By use of the bus bar 36, the source wiring 4a intersects with the gate wiring 3a three-dimensionally. The drain terminal 21a of the semiconductor switching element 1a and the drain terminal 21e of the semiconductor switching element 1e are connected to a common on-board wiring 33, and the source terminal of the semiconductor switching element 1a and the source terminal of the semiconductor switching element 1e are connected to a common on-board wiring 35. Note that the on-board wiring 35 connects the source terminal of the semiconductor switching element 1a and the source terminal of the semiconductor switching element 1e to each other by way of a bus bar 36 so as not to intersect on the plane surface of the circuit board 31 with the on-board wiring 33. By use of the bus bar 36, the on-board wiring 35 intersects with the on-board wiring 33 three-dimensionally. Note that, in FIG. 11, a case has been shown where the gates of the semiconductor switching elements 1a, 1e are connected to the driver circuit 2a by using only the wiring; however, such a configuration may be used in which a gate circuit of a gate resistor, a ferrite bead, a Zener diode, a capacitor or the like, is provided in a common manner between the semiconductor switching elements 1a, 1e and the driver circuit 2a, or gate circuits thereof are provided respectively therebetween.

In the semiconductor module 20 of Embodiment 2, as shown in FIG. 11, the semiconductor switching elements 1a, 1e are mounted in a state in which one of them is rotated on the mounting face of the circuit board 31 by about 90° relative to the other semiconductor switching element, and so that the respective gate terminal 22a and the gate terminal 22e become closer to each other. Namely, an alignment angle provided between the semiconductor switching elements 1a, 1e is about 90°. In other words, an angle provided between the terminal side of the package of the semiconductor switching element 1a at which the drain terminal 21a and the gate terminal 22a are placed or a reference line that is parallel to that terminal side, and the terminal side of the package of the semiconductor switching element 1e at which the drain terminal 21e and the gate terminal 22e are placed or a reference line that is parallel to that terminal side, is about 90°. Accordingly, in the semiconductor module 20 of Embodiment 2, it becomes possible to bring the gate terminals 22a, 22e closer to each other than the length of the terminal side of the package of the semiconductor switching element 1a or 1e, that is the shortest distance between these terminals as a physical limit in the case where the semiconductor switching elements 1a, 1e are mounted in the same direction.

According to the power conversion device 90 of Embodiment 2, in the case where the plural semiconductor elements 1a, 1e connected in parallel to each other, namely, in a parallel relationship, are to be operated by the single driver circuit 2a, the distances between the driver circuit 2a and the respective plural semiconductor switching elements 1a, 1e are shortened, so that it is possible to stably operate the semiconductor switching elements 1a, 1e. Further, according to the power conversion device 90 of Embodiment 2, the gate terminals 22a, 22e and the driver circuit 2a in the semiconductor module 20 become closer to each other, so that the region of the control circuit that deals with small signals, namely, the region of the driver circuit 2a can be packed easily. Thus, it becomes possible to isolate from each other the region of the control circuit that deals with small signals and the region of the power circuit that includes the semiconductor switching elements 1a, 1e and that deals with high electric power, while ensuring a distance enough to prevent noise coupling therebetween. According to the power conversion device 90 of Embodiment 2, since the isolation distance between the region of the control circuit that deals with small signals and the region of the power circuit that deals with high electric power can be ensured, it is possible to prevent noise coupling from the power circuit that deals with high electric power to the control circuit that deals with small signals, to thereby further enhance the operational stability of the semiconductor switching elements 1a, 1e.

Figure 12:
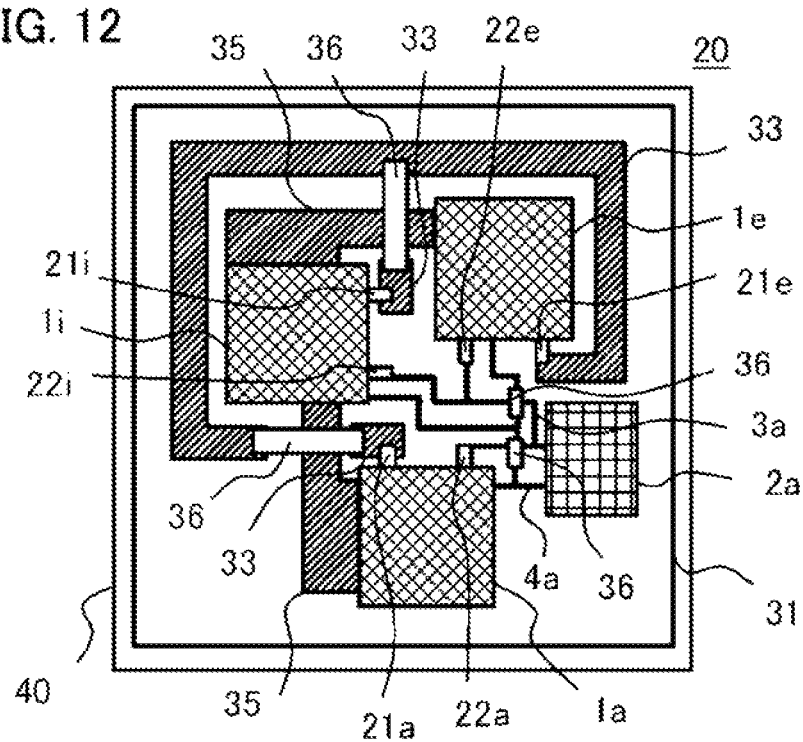
FIG. 12 is a diagram showing another configuration of the semiconductor module which includes semiconductor switching elements in FIG. 10.

In FIG. 11, a case has been shown where the number of the plural semiconductor switching elements which are in a parallel relationship and to be operated by the single driver circuit 2a, is two. The configuration of the semiconductor module 20 of Embodiment 2 is not limited to that in FIG. 11, and may instead be a configuration shown in FIG. 12. FIG. 12 is a diagram showing another configuration of the semiconductor module which includes semiconductor switching elements in FIG. 10. The semiconductor module 20 shown in FIG. 12 corresponds to a case where three semiconductor switching elements 1a, 1e and 1i which are in a parallel relationship to each other, are operated by the single driver circuit 2a. The power conversion device 90 of Embodiment 2 provided with the semiconductor module 20 shown in FIG. 12 corresponds to the case where the number of the plural semiconductor switching devices which are in a parallel relationship and to be operated by each of the driver circuits 2a, 2b, 2c, 2d, is three.

In the semiconductor module 20 shown in FIG. 12, the alignment angle between the semiconductor switching elements 1a, 1e is about 180°, the alignment angle between the semiconductor switching elements 1a, 1i is about 90°, and the alignment angle between the semiconductor switching elements 1e, 1i is about 90°. The gate terminal 22a of the semiconductor switching element 1a, the gate terminal 22e of the semiconductor switching element 1e and the gate terminal 22i of the semiconductor switching element 1i are connected to the driver circuit 2a through a common gate wiring 3a. The source terminal formed on the mounting face (bottom face) of the semiconductor switching element 1a, the source terminal of the semiconductor switching element 1e and the source terminal of the semiconductor switching element 1i are connected to the driver circuit 2a through a common source wiring 4a. Here, the source wiring 4a connects the source terminal of the semiconductor switching element 1a, the source terminal of the semiconductor switching element 1e, the source terminal of the semiconductor switching element 1i and the driver circuit 2a to each other by way of bus bars 36 so as not to intersect on the plane surface of the circuit board 31 with the gate wiring 3a. By use of the bus bars 36, the source wiring 4a intersects with the gate wiring 3a three-dimensionally.

The drain terminal 21a of the semiconductor switching element 1a, the drain terminal 21e of the semiconductor switching element 1e and the drain terminal 21i of the semiconductor switching element 1i are connected to a common on-board wiring 33, and the source terminal of the semiconductor switching element 1a, the source terminal of the semiconductor switching element 1e and the source terminal of the semiconductor switching element 1i are connected to a common on-board wiring 35. Note that the on-board wiring 33 connects the drain terminal 21a of the semiconductor switching element 1a, the drain terminal 21e of the semiconductor switching element 1e and the drain terminal 21i of the semiconductor switching element 1i to each other by way of bus bars 36 so as not to intersect on the plane surface of the circuit board 31 with the on-board wiring 35. By use of the bus bars 36, the on-board wiring 33 intersects with the on-board wiring 35 three-dimensionally. Note that, in FIG. 12, a case has been shown where the gates of the semiconductor switching elements 1a, 1e, 1i are connected to the driver circuit 2a by using only the wiring; however, such a configuration may be used in which a gate circuit of a gate resistor, a ferrite bead, a Zener diode, a capacitor or the like, is provided in a common manner between the semiconductor switching elements 1a, 1e, 1i and the driver circuit 2a, or gate circuits thereof are provided respectively therebetween.

The power conversion device 90 of Embodiment 2 provided with the semiconductor module 20 shown in FIG. 12 corresponds to the case where the number of the plural semiconductor switching device which are in a parallel relationship and to be operated by each of the driver circuits 2a, 2b, 2c, 2d, is three. Even in this case, like in the power conversion device 90 of Embodiment 2 provided with the semiconductor module 20 shown in FIG. 11, the distances between the driver circuit 2a and the plural semiconductor switching elements 1a, 1e, 1i are shortened, so that it is possible to enhance the operational stability of the semiconductor switching elements 1a, 1e, 1i. Further, according to the power conversion device 90 of Embodiment 2 provided with the semiconductor module 20 shown in FIG. 12, since the isolation distance between the region of the control circuit that deals with small signals and the region of the power circuit that deals with high electric power can be ensured, it is possible to prevent noise coupling from the power circuit that deals with high electric power to the control circuit that deals with small signals, to thereby further enhance the operational stability of the semiconductor switching elements 1a, 1e, 1i.

Embodiment 3

Figure 13:
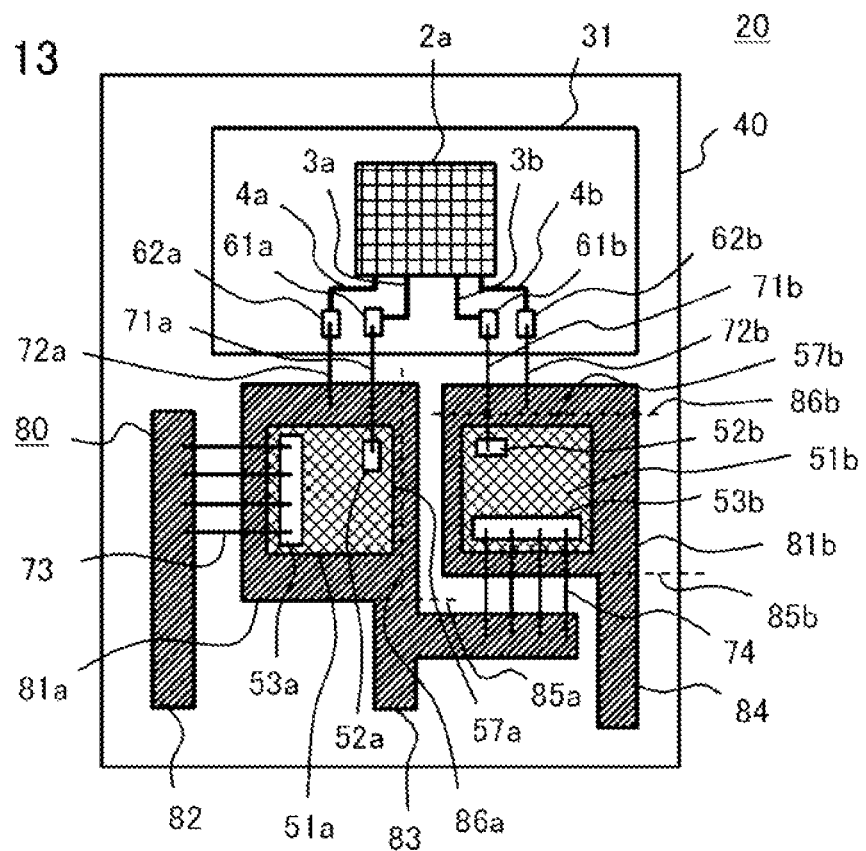
FIG. 13 is a diagram showing a configuration of a semiconductor module according to Embodiment 3.

In Embodiments 1, 2, the package of the semiconductor switching element is exemplified by a surface mount package; however, a bare chip may be used as the semiconductor switching element. FIG. 13 is a diagram showing a configuration of a semiconductor module according to Embodiment 3. The semiconductor module 20 of Embodiment 3 is a semiconductor module which includes a half-bridge circuit composed of bare-chip semiconductor switching elements 51a, 51b, and a driver circuit 2a. The plural bare-chip semiconductor switching elements 51a, 51b are operated by the single driver circuit 2a. The semiconductor module 20 shown in FIG. 13 is a component of the single-phase inverter 12 in the power conversion device 90 of FIG. 1. The bare-chip semiconductor switching elements 51a, 51b have the same shape and correspond to the semiconductor switching elements 1a, 1b in FIG. 1, respectively. The driver circuit 2a is mounted on a circuit board 31, and the semiconductor switching elements 51a, 51b are mounted on a lead frame 80. In FIG. 13, a case is shown where a cooler 40 is placed in a state attached to the circuit board 31 and attached through an insulating member (for example, a ceramic board) to the lead frame 80.

The lead frame 80 includes: a die pad 81a on which the semiconductor switching element 51a is mounted; a die pad 81b on which the semiconductor switching element 51b is mounted; a lead 82; a lead 83 connected to the die pad 81a; and a lead 84 connected to the die pad 81b. A broken line 85a indicates a boundary between the die pad 81a and the lead 83, and a broken line 85a indicates a boundary between the die pad 81b and the lead 84. The semiconductor switching element 51a includes: a gate pad 52a to which a control signal (drive signal) generated by the driver circuit 2a is inputted; a drain pad 53a through which power flows that has been supplied from the input power source 11 and is higher than that of the control signal; and a source electrode (not illustrated) which is formed on the back face and connected to the die pad 81a. The semiconductor switching element 51b includes: a gate pad 52b to which a control signal (drive signal) generated by the driver circuit 2a is inputted; a drain pad 53b through which power flows that has been supplied from the input power source 11 and is higher than that of the control signal; and a source electrode (not illustrated) which is formed on the back face and connected to the die pad 81b. The gate pads 52a, 52b of the semiconductor switching elements 51a, 51b correspond to the gate terminals 22a, 22b of the semiconductor switching elements 1a, 1b shown in FIG. 2, respectively. The drain pads 53a, 53b of the semiconductor switching elements 51a, 51b correspond to the drain terminals 21a, 21b of the semiconductor switching elements 1a, 1b shown in FIG. 2, respectively. The source electrodes of the semiconductor switching elements 51a, 51b correspond to the source terminals of the semiconductor switching elements 1a, 1b shown in FIG. 2, respectively.

On the circuit board 31, there are formed: a gate pad 61a connected through a connection member 71a to the gate pad 52a of the semiconductor switching element 51a; a source pad 62a connected through a connection member 72a to the die pad 81a connected to the source electrode of the semiconductor switching element 51a; a gate pad 61b connected through a connection member 71b to the gate pad 52b of the semiconductor switching element 51b; and a source pad 62b connected through a connection member 72b to the die pad 8 lb connected to the source electrode of the semiconductor switching element 51b. The driver circuit 2a is connected to the gate pads 61a, 61b by means of gate wirings 3a, 3b, respectively, and connected to the source pads 62a, 62b by means of source wirings 4a, 4b, respectively. The drain pad 53a of the semiconductor switching element 51a is connected through connection members 73 to the lead 82. The drain pad 53b of the semiconductor switching element 5 lb is connected through connection members 74 to the lead 83. The connection members 71a, 71b, 72a, 72b, 73, 74 are, for example, bonding wires. The lead 83 is a wiring for connecting the source electrode of the semiconductor switching element 51a with the drain pad 53b of the semiconductor switching element 51b, namely, a wiring that constitutes the connection point 5a in FIG. 1. The lead 83 corresponds to the on-board wiring 34 in FIG. 2. The leads 82, 84 correspond to the on-board wirings 33, 35 in FIG. 2, respectively.

It is noted that, in FIG. 13, a case has been shown where the driver circuit 2a is mounted on the circuit board 31 that is a metallic board using a metal as a base material or a glass-epoxy based circuit board including multiple wiring layers; however, the driver circuit 2a may be mounted on the lead frame 80 on which the bare-chip semiconductor switching elements 51a, 51b are mounted.

As shown in FIG. 13, the plural bare-chip semiconductor switching elements 51a, 51b are mounted in a state in which one of them is rotated on the mounting face of the lead frame 80 by an angle of 45° or more, for example, by about 90°, relative to the other element, and so that the respective gate pads 52a, 52b become closer to each other. FIG. 13 shows a case where the respective semiconductor switching elements 51a, 51b are placed so that a reference line 86a that is parallel to a chip side 57a of the semiconductor switching element 51a that is closest to the gate pad 52a (control terminal), and a reference line 86b that is parallel to a chip side 57b of the semiconductor switching element 51b that is closest to the gate pad 52b (control terminal), are oriented in directions that are mutually rotated by an angle of not less than 45° but not more than 180°. Note that, like in FIG. 9, the plural bare-chip semiconductor switching elements 51a, 51b may be mounted in a state in which one of them is rotated on the mounting face of the lead frame 80 by an angle of 45° or more, for example, by about 180°, relative to the other element, and so that the respective gate pads 52a, 52b become closer to each other.

Here, let's assume a shortest distance as a physical limit in the case where the plural bare-chip semiconductor switching elements 51a, 51b are mounted in the same direction, namely, a limit distance between their respective control terminals (gate pads 52a, 52b). The limit distance is a distance as the sum of; the length of the chip side 57a or 57b that is closest to the gate pad 52a or 52b; the distance between the die pad 81a and the die pad 81b; the distance in the die pad 81a from an edge of the semiconductor switching element 51a to an edge of the die pad 81a, each of these edges facing the other bare chip; and the distance in the die pad 81b from an edge of the semiconductor switching element 51b to an edge of the die pad 81b, each of these edges facing the other bare chip. In the semiconductor module 20 of Embodiment 3 shown in FIG. 13, it becomes possible to bring the gate pads 52a, 52b of the plural bare-chip semiconductor switching elements 51a, 51b closer to each other than the limit distance (limit distance 1) in the case where the plural bare-chip semiconductor switching elements 51a, 51b are mounted in the same direction. Accordingly, in the case where the plural bare-chip semiconductor switching elements 51a, 51b are to be operated by the single driver circuit 2a, the distances between the driver circuit 2a and the respective plural bare-chip semiconductor switching elements 51a, 51b are shortened, so that it is possible to stably operate the plural bare-chip semiconductor switching elements 51a, 51b.

In the semiconductor module 20 of Embodiment 3, the plural semiconductor switching elements 51a, 51b to be operated together by the single driver circuit 2a, are provided as chips having the same shape, and placed in such a positional relationship in which an inter-control-terminal distance (inter-gate-terminal distance L) that is a distance between their respective control terminals (gate pads 52a, 52b) is shorter than the limit distance for the plural bare chips mounted in the same direction. When the plural bare-chip semiconductor switching elements 51a, 51b are so placed, the distances between the single driver circuit 2a and the respective plural bare-chip semiconductor switching elements 51a, 51b are shortened, so that it is possible to stably operate the plural bare-chip semiconductor switching elements 51a, 51b.

It is noted that, in the case where the areas of the bare-chip semiconductor switching elements 51a, 51b are respectively larger than or equal to the areas of the mounting faces of die pads 81a, 81b on which the bare chips are mounted, a limit distance (limit distance 2) provided when the plural bare-chip semiconductor switching elements 51a, 51b are mounted in the same direction, becomes shorter than the limit distance 1. The limit distance 2 is a distance as the sum of: the length of the chip side 57a or 57b that is closest to the gate pad 52a or 52b; and the distance between the semiconductor switching element 51a and the semiconductor switching element 51b. Even in this case, in the semiconductor module 20 of Embodiment 3, it becomes possible to bring the gate pads 52a, 52b of the plural bare-chip semiconductor switching elements 51a, 51b closer to each other than the limit distance (limit distance 2) provided when the plural bare-chip semiconductor switching elements 51a, 51b are mounted in the same direction.

The power conversion device 90 of Embodiment 3 is a power conversion device which includes the plural semiconductor switching elements 51a, 51b and performs power conversion of input power by controlling on-periods of the plural semiconductor switching elements 51a, 51b, said power conversion device comprising: the lead frame 80 on which the plural semiconductor switching elements 51a, 51b are mounted as bare chips; and the driver circuit 2a which is mounted on the lead frame 80 or the circuit board 31 on which wirings (gate wirings 3a, 3b, source wirings 4a, 4b) are formed, and operates at least two of the plural semiconductor switching elements 51a, 51b together. The semiconductor switching elements 51a, 51b have control terminals (gate pads 52a, 52b) to which control signals generated by the driver circuit 2a are inputted, said control terminals and the driver circuit 2a being connected to each other through the connection members 71a, 71b, respectively. The plural semiconductor switching elements 51a, 51b to be operated together by the driver circuit 2a, are provided as chips having the same shape, and placed so that their respective reference lines 86a, 86b that are parallel to their respective chip sides 57a, 57b closest to the control terminals (gate pads 52a, 52b), are oriented in directions that are mutually rotated by an angle of not less than 45° but not more than 180°. According to the power conversion device 90 of Embodiment 3, because of such a configuration, since the driver circuit 2a operates the plural semiconductor switching elements 51a, 51b together which are placed in the positional relationship in which the distance between their respective control terminals (inter-gate-terminal distance L) is shorter than the limit distance provided when the plural bare-chips are mounted in the same direction, it is possible to enhance the operational stability of the semiconductor switching elements 51a, 51b.

Embodiment 4

Figure 14:
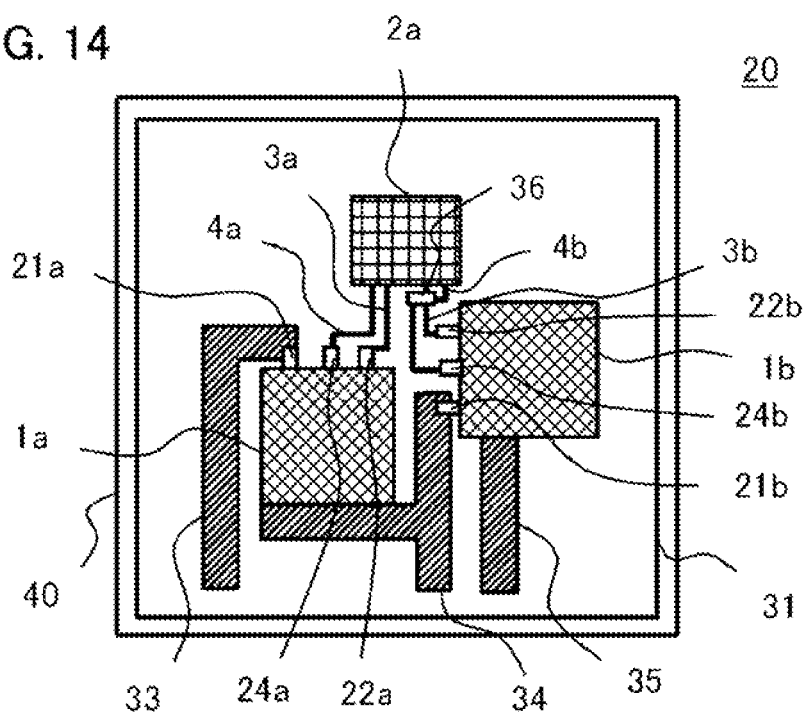
FIG. 14 is a diagram showing a configuration of a semiconductor module according to Embodiment 4.

In Embodiments 1 and 2, such cases have been described where the semiconductor switching element 1 is provided with the drain terminal 21, the gate terminal 22 and the source terminals 23, namely, installed in a three-terminal package. However, the semiconductor switching element 1 may be installed in a four-terminal package which further includes a source connection terminal connected to the source terminal 23. FIG. 14 is a diagram showing a configuration of a semiconductor module according to Embodiment 4. The semiconductor module 20 of Embodiment 4 differs from the semiconductor module 20 shown in FIG. 2 in that the semiconductor switching elements 1a, 1b are provided with source connection terminals 24a, 24b, respectively. A driver circuit 2a is connected to the source connection terminal 24a of the semiconductor switching element 1a by means of a source wiring 4a, and the driver circuit 2a is connected to the source connection terminal 24b of the semiconductor switching element 1b by means of a source wiring 4b. Here, the source wiring 4b connects the source connection terminal 24b of the semiconductor switching element 1b and the driver circuit 2a to each other by way of a bus bar 36 so as not to intersect on a plane surface with the gate wiring 3b. With reference to the potential at the source connection terminals 24a, 24b, the driver circuit 2a generates control signals (drive signals) for operating the semiconductor switching elements 1a, 1b. The source connection terminals 24a, 24b may also be referred to as reference terminals because the reference potential at the time of generating the control signals (drive signals) are inputted to them.

In the semiconductor module 20 of Embodiment 4, like in the semiconductor module 20 of Embodiment 1, it becomes possible to bring the gate terminals 22a, 22b closer to each other than the length of the terminal side of each of the packages of the semiconductor switching modules 1a, 1b, that is the shortest distance as a physical limit in the case where the semiconductor switching elements 1a, 1b are mounted in the same direction. Accordingly, the semiconductor module 20 of Embodiment 4 accomplishes an effect similar to that of the semiconductor module 20 of Embodiment 1. Since the semiconductor module 20 of Embodiment 4 accomplishes the similar effect to that of the semiconductor module 20 of Embodiment 1, the power conversion device 90 of Embodiment 4 in which the semiconductor module 20 of Embodiment 4 is installed, accomplishes an effect similar to that of the power conversion device 90 of Embodiment 1.

It is noted that, in Embodiments 1 to 4, the power conversion device 90 is exemplified by an insulated full-bridge type DC-DC converter; however, this circuit configuration is not limitative, and the power conversion device may be an LLC-based or a half-bridge type DC-DC converter or the like, if it has a configuration in which surface-mounted two semiconductor switching elements are operated by a single driver circuit. Further, the power conversion device 90 of each of Embodiments 1 to 4 which includes the plural semiconductor switching elements that are mounted with the alignment angle of not less than 45° but not more than 180° as a relative angle therebetween, is not limited to a DC-DC converter and may, of course, be applied as another switching-associated power conversion device, such as, an inverter or an AC-DC converter, for example, a semi bridgeless AC-DC converter, a totem-pole type AC-DC converter, or the like.

It should be noted that, in this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

DESCRIPTION OF REFERENCE NUMERALS AND SIGNS 1, 1a, 1b, 1c, 1d, 1e, 1f, 1g, 1h, 1i: semiconductor switching element, 2a, 2b, 2c, 2d: driver circuit, 21, 21a, 21b, 21e, 21i: drain terminal (second power terminal), 22, 22a, 22b, 22e, 22i: gate terminal (control terminal), 23: source terminal (first power terminal), 24a, 24b: source connection terminal (reference terminal), 31: circuit board, 33, 34, 35, 39a, 39b: on-board wiring, 52a, 52b: gate pad (reference terminal), 57a, 57b: chip side, 71a, 71b: connection member, 86a, 86b: reference line, 90: power conversion device, L: inter-gate-terminal distance, lt: terminal-side length.

The invention claimed is:
1. A power conversion device which includes plural semiconductor switching elements and performs power conversion of input power by controlling on-periods of the plural semiconductor switching elements, said power conversion device comprising:
 a circuit board on which wirings are formed and the plural semiconductor switching elements are mounted; and
 a driver circuit which is mounted on the circuit board, and operates at least two of the plural semiconductor switching elements to be operated together by the driver circuit;
 wherein the semiconductor switching elements each have a control terminal to which a control signal generated by the driver circuit is inputted, a first power terminal at which a voltage potential serving as a voltage reference for the control signal is produced, and a second power terminal through which power flows that is higher than that of the control signal; and
 wherein the semiconductor switching elements to be operated together by the driver circuit are provided as packages having a same shape and placed in such a positional relationship in which an inter-control-terminal distance, that is a distance between centers of their respective control terminals, is shorter than a length of a terminal side that is a side of each of the packages at which the control terminal is placed.
2. The power conversion device of claim 1, wherein the semiconductor switching elements to be operated together by the driver circuit are placed so that their respective reference lines that are parallel to their respective terminal sides are oriented in directions that are mutually rotated by an angle of not less than 45° but not more than 180°.

3. The power conversion device of claim 2, wherein the semiconductor switching elements to be operated together by the driver circuit include a pair of semiconductor switching elements whose respective terminal sides are placed opposite to each other.

4. The power conversion device of claim 3, wherein the semiconductor switching elements to be operated together by the driver circuit are connected serially to each other.

5. The power conversion device of claim 3, wherein the semiconductor switching elements to be operated together by the driver circuit are connected in parallel to each other.

6. The power conversion device of claim 2, wherein the semiconductor switching elements to be operated together by the driver circuit are connected serially to each other.

7. The power conversion device of claim 2, wherein the semiconductor switching elements to be operated together by the driver circuit are connected in parallel to each other.

8. The power conversion device of claim 1, wherein the semiconductor switching elements to be operated together by the driver circuit are connected serially to each other.

9. The power conversion device of claim 1, wherein the semiconductor switching elements to be operated together by the driver circuit are connected in parallel to each other.

10. The power conversion device of claim 1, wherein, with respect to the semiconductor switching elements to be operated together by the driver circuit, their respective first power terminals are connected to each other through one of the wirings formed on the circuit board.

11. The power conversion device of claim 1, wherein, with respect to the semiconductor switching elements to be operated together by the driver circuit, their respective second power terminals are connected to each other through one of the wirings formed on the circuit board.

12. The power conversion device of claim 1, wherein the driver circuit operates, independently, the semiconductor switching elements to be operated together.

13. The power conversion device of claim 1, wherein, in each of the semiconductor switching elements to be operated together by the driver circuit, either one of the first power terminal and the second power terminal is formed on a bottom face of the element that is opposite to the circuit board; and an area of said one of the power terminals formed on the bottom face is larger than an area of a connection face where the other one of the power terminals not formed on the bottom face is connected to one of the wirings on the circuit board.

14. The power conversion device of claim 1, wherein, in each of the semiconductor switching elements to be operated together by the driver circuit, either one of the first power terminal and the second power terminal is placed at the terminal side at which the control terminal is placed.

15. The power conversion device of claim 1, wherein, in each of the semiconductor switching elements to be operated together by the driver circuit, the first power terminal is formed on a bottom face of the semiconductor switching element that is opposite to the circuit board, and the second power terminal is placed at the terminal side; and wherein an area of the first power terminal formed on the bottom face is larger than an area of a connection face where the second power terminal is connected to one of the wirings on the circuit board.

16. The power conversion device of claim 1, wherein, in each of the semiconductor switching elements to be operated together by the driver circuit, the second power terminal is formed on a bottom face of the semiconductor switching element that is opposite to the circuit board, and the first power terminal is placed at the terminal side; and wherein an area of the second power terminal formed on the bottom face is larger than an area of a connection face where the first power terminal is connected to one of the wirings on the circuit board.

17. The power conversion device of claim 1, wherein the circuit board is a metallic board using a metal as a base material.

18. The power conversion device of claim 1, wherein the semiconductor switching element to be operated together by the driving circuit further has a reference terminal connected to the first power terminal; and
wherein the driver circuit is connected to the reference terminal and generates the control signal with reference to a potential at the reference terminal.

19. The power conversion device of claim 1, wherein the semiconductor switching elements to be operated together by the driver circuit are each a semiconductor element using a wide bandgap semiconductor material.

20. A power conversion device which includes plural semiconductor switching elements and performs power conversion of input power by controlling on-periods of the plural semiconductor switching elements, said power conversion device comprising:
a lead frame on which the plural semiconductor switching elements are mounted as bare chips; and
a driver circuit which is mounted on the lead frame or a circuit board on which wirings are formed, and operates at least two of the plural semiconductor switching elements together;
a cooler attached to the lead frame or the circuit board opposite to the semiconductor switching elements and the driver circuit through an insulating member;
wherein the semiconductor switching elements each has a control terminal to which a control signal generated by the driver circuit is inputted, said control terminal and said driver circuit being connected to each other through a connection member; and
wherein the semiconductor switching elements to be operated together by the driver circuit, are provided as chips having a same shape, and placed so that their respective reference lines that are parallel to their respective chip sides each closest to the control terminal, are oriented in directions that are mutually rotated by an angle of about 45°.

* * * * *